United States Patent
Nitta et al.

(10) Patent No.: US 12,374,646 B2
(45) Date of Patent: Jul. 29, 2025

(54) BONDING FILM, TAPE FOR WAFER PROCESSING, METHOD FOR PRODUCING BONDED BODY, AND BONDED BODY AND PASTED BODY

(71) Applicant: FURUKAWA ELECTRIC CO., LTD., Tokyo (JP)

(72) Inventors: Norzafriza Nitta, Tokyo (JP); Hidemichi Fujiwara, Tokyo (JP); Yoshihiro Sato, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 472 days.

(21) Appl. No.: 17/647,903

(22) Filed: Jan. 13, 2022

(65) Prior Publication Data

US 2022/0139864 A1 May 5, 2022

Related U.S. Application Data

(63) Continuation of application No. PCT/JP2020/025904, filed on Jul. 1, 2020.

(30) Foreign Application Priority Data

Jul. 16, 2019 (JP) .................. 2019-131050

(51) Int. Cl.
  *H01L 23/00* (2006.01)
  *C09J 7/38* (2018.01)
  (Continued)

(52) U.S. Cl.
  CPC .............. *H01L 24/29* (2013.01); *C09J 7/385* (2018.01); *C09J 9/02* (2013.01); *C09J 11/04* (2013.01);
  (Continued)

(58) Field of Classification Search
  CPC ...... C08K 2003/0806; C08K 2003/085; C08K 2201/001; C08K 2201/005;
  (Continued)

(56) References Cited

U.S. PATENT DOCUMENTS

| 2007/0031660 A1* | 2/2007 | Kanamaru ................ C09J 7/29 |
| | | 428/355 R |
| 2013/0001775 A1 | 1/2013 | Nishikubo et al. |

(Continued)

FOREIGN PATENT DOCUMENTS

| CN | 106574164 A | 4/2017 |
| CN | 108473824 A | 8/2018 |

(Continued)

OTHER PUBLICATIONS

Extended European Search Report issued Jul. 11, 2023 in European Patent Application No. 20841520.8, 11 pages.

(Continued)

*Primary Examiner* — Julio J Maldonado
*Assistant Examiner* — Stanetta D Isaac
(74) *Attorney, Agent, or Firm* — Oblon, McClelland, Maier & Neustadt, L.L.P.

(57) ABSTRACT

A bonding film for bonding a semiconductor element and a substrate. The bonding film has an electroconductive bonding layer formed by molding an electroconductive paste including metal fine particles (P) into a film form, and a tack layer having tackiness and laminated on the electroconductive bonding layer. The tack layer includes 0.1% to 1.0% by mass of metal fine particles (M) with respect to the metal fine particles (P) in the electroconductive bonding layer, and the metal fine particles (M) have a melting point of 250° C. or lower.

20 Claims, 2 Drawing Sheets

(51) Int. Cl.
*C09J 9/02* (2006.01)
*C09J 11/04* (2006.01)
*C09J 101/02* (2006.01)
*C09J 171/00* (2006.01)
*H01L 21/683* (2006.01)

(52) U.S. Cl.
CPC ........... *C09J 101/02* (2013.01); *C09J 171/00* (2013.01); *H01L 21/6836* (2013.01); *H01L 24/27* (2013.01); *H01L 24/32* (2013.01); *C09J 2401/00* (2013.01); *C09J 2409/006* (2013.01); *C09J 2423/106* (2013.01); *C09J 2433/00* (2013.01); *C09J 2467/006* (2013.01); *C09J 2471/00* (2013.01); *H01L 24/83* (2013.01); *H01L 2221/68386* (2013.01); *H01L 2224/27003* (2013.01); *H01L 2224/271* (2013.01); *H01L 2224/27436* (2013.01); *H01L 2224/29082* (2013.01); *H01L 2224/2929* (2013.01); *H01L 2224/29294* (2013.01); *H01L 2224/29311* (2013.01); *H01L 2224/29339* (2013.01); *H01L 2224/29344* (2013.01); *H01L 2224/29347* (2013.01); *H01L 2224/29355* (2013.01); *H01L 2224/29499* (2013.01); *H01L 2224/3205* (2013.01); *H01L 2224/32225* (2013.01); *H01L 2224/32245* (2013.01); *H01L 2224/8384* (2013.01)

(58) Field of Classification Search
CPC ........... C09J 2203/326; C09J 2301/208; C09J 2301/302; C09J 2301/314; C09J 2301/408; C09J 7/30; C09J 171/02; H01L 24/27; H01L 24/32; H01L 24/83; H01L 24/05; H01L 24/48; H01L 2221/68336; H01L 2224/04026; H01L 2224/05073; H01L 2224/05166; H01L 2224/05639; H01L 2224/05644; H01L 2224/05647; H01L 2224/05655; H01L 2224/2711; H01L 2224/2712; H01L 2224/29305; H01L 2224/29317; H01L 2224/29318; H01L 2224/29323; H01L 2224/29324; H01L 2224/29349; H01L 2224/29364; H01L 2224/29366; H01L 2224/29369; H01L 2224/29386; H01L 2224/29405; H01L 2224/29417; H01L 2224/29418; H01L 2224/29423; H01L 2224/29424; H01L 2224/29449; H01L 2224/29466; H01L 2224/32501; H01L 2224/45124; H01L 2224/45144; H01L 2224/45147; H01L 2224/83447; H01L 2224/85447; H01L 2224/2939; H01L 2224/3201; H01L 2224/32227; H01L 2224/32505; H01L 2224/48227; H01L 2224/83203; H01L 2224/85203; H01L 2224/85207; H01L 2224/94; H01L 2224/73265; H01L 2224/83191; H01L 2224/92247; H01L 2221/68327; H01L 2224/29001; H01L 2224/29099; H01L 21/683; H01L 21/6831; H01L 21/6833; H01L 21/6835; H01L 21/6836; H01L 21/68714; H01L 21/689742

See application file for complete search history.

(56) References Cited

U.S. PATENT DOCUMENTS

| | | | |
|---|---|---|---|
| 2017/0152410 | A1 | 6/2017 | Aoyama et al. |
| 2017/0152411 | A1 | 6/2017 | Mihara et al. |
| 2018/0026003 | A1* | 1/2018 | Mihara .............. C09J 7/30 428/355 EP |
| 2018/0346766 | A1 | 12/2018 | Mihara et al. |
| 2018/0346767 | A1* | 12/2018 | Mihara .............. C09J 11/06 |
| 2019/0016928 | A1 | 1/2019 | Mihara et al. |
| 2019/0264072 | A1 | 8/2019 | Nitta et al. |
| 2021/0189197 | A1 | 6/2021 | Nitta et al. |
| 2021/0189198 | A1 | 6/2021 | Nitta et al. |
| 2021/0348038 | A1 | 11/2021 | Nitta et al. |

FOREIGN PATENT DOCUMENTS

| | | |
|---|---|---|
| CN | 109715752 A | 5/2019 |
| EP | 3 509 093 A1 | 7/2019 |
| JP | 2006-352080 A | 12/2006 |
| JP | 2010-265453 A | 11/2010 |
| JP | 2013-236090 A | 11/2013 |
| JP | 2015-004122 A | 1/2015 |
| JP | 2017-141366 A | 8/2017 |
| WO | WO 2016/031552 A1 | 3/2016 |
| WO | WO 2018/092671 A1 | 5/2018 |
| WO | WO 2018/116813 A1 | 6/2018 |

OTHER PUBLICATIONS

"Bismuth-Tin 58-42," Alloy Digest, vol. 32, No. 12, XP093059730, Dec. 1983, 2 pages.

International Search Report issued Sep. 15, 2020 in PCT/JP2020/025904 filed on Jul. 1, 2020, 6 pages (with English Translation).

Taiwanese Office Action issued Sep. 6, 2021 in Taiwanese Patent Application No. 109123380, 6 pages (with English Machine Translation).

\* cited by examiner

BONDING FILM, TAPE FOR WAFER PROCESSING, METHOD FOR PRODUCING BONDED BODY, AND BONDED BODY AND PASTED BODY

TECHNICAL FIELD

The present invention relates to a bonding film and a tape for wafer processing, and more particularly, the invention relates to a connection film for connecting a semiconductor element and a substrate such as a circuit substrate or a ceramic substrate, and a tape for wafer processing including this connection film.

BACKGROUND ART

For the adhesion of semiconductor chips to wiring boards and the like, film-like adhesives (die attach films) have been conventionally used. Furthermore, a dicing-die bonding tape that combines the functions of two tapes, namely, a dicing tape for fixing a semiconductor wafer at the time of cutting and separating (dicing) a semiconductor wafer into individual chips, and a die attach film (also referred to as die bonding film) for adhering the cut semiconductor chips to a wiring board or the like, has been developed (see, for example, Patent Document 1).

When such a dicing-die bonding tape is used for the connection of semiconductor elements that implement control and supply of electric power (so-called power semiconductor element) and substrates such as a circuit substrate, a ceramic substrate, and a lead frame, there is a problem that connection heat resistance is not sufficient.

For the connection of power semiconductor elements with substrates, solder is generally used. Regarding such solder, a cream solder obtained by adding flux to a powder of solder and adjusting the mixture to have an appropriate viscosity is mainly used. However, when flux is used, there is a possibility of contaminating the semiconductor element surface, and there is a problem that a washing step is needed. Furthermore, in recent years, it is required to use lead-free solder materials that do not include lead, in consideration of the environment. As a lead-free solder material that can cope with heat generation of power semiconductors, there is available Au—Sn-based solder; however, since this solder is highly expensive, it is not practically useful. There is Sn—Ag—Cu-based solder as a solder material that is cheaper than the Au—Sn-based solder; however, there is a problem that the growth of intermetallic compounds due to thermal history leads to a decrease in reliability.

As a bonding member that does not use solder, there is an Anisotropic Conductive Film (ACF) obtained by forming a mixture of a thermosetting resin and fine metal particles having electrical conductivity into a film form. However, an ACF includes resins at a certain proportion or more in order to obtain a satisfactory adhesion state. Therefore, there has been a problem that the contact between metal particles becomes point contact, sufficient heat conduction is not expected, and connection heat resistance is not sufficient. Furthermore, since there is concern about deterioration of the thermosetting resin caused by intense heat, the ACF is not suitable for the connection of power semiconductors having large amounts of heat generation.

Furthermore, as another bonding member that does not use solder, recently, a paste including metal fine particles (hereinafter, referred to as metal paste) is available (see, for example, Patent Document 2). The metal paste is a product obtained by adding an organic dispersant that prevents condensation between the metal fine particles during storage or during a production process, and a dispersion auxiliary substance that reacts with the organic dispersant upon bonding and removes the organic dispersant, to the metal fine particles, mixing this with a solvent and the like, and preparing the mixture into a paste form. The metal fine particles include at least very fine particles having a particle size of about 1 to 500 nm, and the surface is in an active state.

In order to bond a semiconductor element and a substrate using a metal paste, the metal paste is applied on the bonding surface of the semiconductor element and/or the substrate by means of a dispenser or by screen printing, and the metal paste is heated at 150° C. to 300° C. for a predetermined time (about 1 minute to 1 hour). As a result, the organic dispersant reacts with the dispersant auxiliary material, the organic dispersant is removed, and at the same time, the solvent is also volatilized and removed. When the organic dispersant and the solvent are removed, the metal fine particles in an active state are bound with one another, and a simple substance film of the metal component is formed.

When the metal paste is applied on the bonding surface using a dispenser or screen printing, it is necessary to lower the viscosity of the metal paste to some extent by regulating the amount of the solvent or the like. However, when the viscosity is lowered, there is a problem that at the time of applying the metal paste on the bonding surface, the metal paste flies apart in all directions and adheres to portions other than the bonding surface of the semiconductor element or the substrate, and the semiconductor element or the substrate is contaminated.

Thus, a connection sheet obtained by forming in advance a metal paste into a sheet form has been proposed (see Patent Document 3). However, when a semiconductor element and a substrate are bonded using a connection sheet having a bonding layer, which is a layer obtained by forming in advance a metal paste such as that described in Patent Document 3 into a sheet form, since the bonding layer itself does not have tacky adhesiveness, it is necessary that the bonding layer is placed on a substrate by using a suction jig or the like, a semiconductor element is placed thereon, and then the bonding layer is sintered. For this reason, there is a problem that the process becomes complicated.

In order to solve the above-described problems, a wafer processing tape that improves the problem of tacky adhesiveness of the bonding layer and simplifies the bonding process, has been proposed (see Patent Document 4). The wafer processing tape for bonding a semiconductor element and a substrate as described in Patent Document 4 is characterized by having a tacky adhesive film having a base material film and a tacky adhesive layer provided on the base material film; an electroconductive bonding layer provided on the tacky adhesive film by molding an electroconductive paste including metal fine particles (P) into a film form; and a tack layer having tackiness and laminated on the electroconductive bonding layer.

CITATION LIST

Patent Document

Patent Document 1: JP 2010-265453 A
Patent Document 2: JP 2006-352080 A
Patent Document 3: JP 2013-236090 A
Patent Document 4: WO 2018/092671 A

SUMMARY OF THE INVENTION

Problem to be Solved by the Invention

However, the wafer processing tape described in the above-described Patent Document 4 has a problem that the type of the semiconductor element that can be bonded is limited by the type of the metal fine particles constituting the electroconductive bonding layer. For example, when copper fine particles are used as the metal fine particles, bonding to a copper electrode or a gold electrode is considered satisfactory, while when silver fine particles are used as the metal fine particles, bonding to a silver electrode or a gold electrode is considered satisfactory, and the types of the electroconductive bonding layer and the electrode of the semiconductor element are limited.

Thus, it is an object of the present invention to provide a bonding film that has sufficient connection heat resistance and high reliability, enables satisfactory bonding to a substrate irrespective of the type of the electrode of the semiconductor element, and makes the bonding step simple and easy; a tape for wafer processing; a method for producing a bonded body; a bonded body; and a pasted body.

Means for Solving Problem

In order to solve the above-described problems, the bonding film according to the invention is a bonding film for bonding a semiconductor element and a substrate, the bonding film having an electroconductive bonding layer formed by molding an electroconductive paste including metal fine particles (P) into a film form; and a tack layer having tackiness and laminated on the electroconductive bonding layer, wherein the tack layer includes 0.1% to 1.0% by mass of metal fine particles (M) with respect to the metal fine particles (P) in the electroconductive bonding layer, and the metal fine particles (M) have a melting point of 250° C. or lower.

With regard to the bonding film, it is preferable that the average primary particle size of the metal fine particles (P) is 10 to 500 nm.

Furthermore, with regard to the bonding film, it is preferable that the electroconductive paste includes an organic solvent (S).

Furthermore, with regard to the bonding film, it is preferable that the metal fine particles (P) include copper or silver.

Furthermore, with regard to the bonding film, it is preferable that the electroconductive paste includes an organic binder (R).

Furthermore, with regard to the bonding film, it is preferable that the tack layer is formed from one kind or two or more kinds selected from polyglycerin, a glycerin fatty acid ester, a polyglycerin fatty acid ester, phosphines, phosphites, sulfides, disulfides, trisulfides, a and sulfoxides.

Furthermore, with regard to the bonding film, it is preferable that the metal fine particles (M) also have an average primary particle size of 1 to 3 μm.

Furthermore, with regard to the bonding film, it is preferable that the metal fine particles (M) include tin.

Furthermore, with regard to the bonding film, it is preferable that the organic solvent (S) includes an organic solvent (SC) having a boiling point at normal pressure of 100° C. or higher, the organic solvent (SC) being formed from an alcohol and/or polyhydric alcohol having one or two or more hydroxyl groups in the molecule.

Furthermore, with regard to the bonding film, it is preferable that the organic binder (R) is one kind or two or more kinds selected from a cellulose resin-based binder, an acetate resin-based binder, an acrylic resin-based binder, a urethane resin-based binder, a polyvinylpyrrolidone resin-based binder, a polyamide resin-based binder, a butyral resin-based binder, and a terpene-based binder.

Furthermore, in order to solve the above-described problems, a tape for wafer processing according to the invention has a tacky adhesive film having a base material film and a tacky adhesive layer provided on the base material film; and the bonding film according to any one of the descriptions given above, wherein the electroconductive bonding layer of the bonding film is provided on the tacky adhesive layer.

Furthermore, in order to solve the above-described problems, a method for producing a bonded body according to the invention has a bonding step of disposing a bonding film between a semiconductor element and a substrate, the bonding film having an electroconductive bonding layer formed by molding an electroconductive paste including metal fine particles (P) into a film form; and a tack layer having tackiness, including metal fine particles (M), and being laminated on the electroconductive bonding layer, subsequently heating the assembly, and after the tack layer is thermally decomposed and the metal fine particles (M) melt and then react with the electrode of the semiconductor element, sintering the metal fine particles (P) of the electroconductive bonding layer to bond the semiconductor element and the substrate.

Furthermore, in order to solve the above-described problems, a bonded body of a semiconductor and a substrate according to the invention is a bonded body of a semiconductor and a substrate, the bonded body having, on a substrate, an electroconductive connection member formed from a porous metal body and having a semiconductor element thereon, wherein the bonded body is bonded using the bonding film according to any one of the descriptions given above, the porous metal body is a sintered body of metal fine particles (P) included in the bonding film, and at the interface between the porous metal body and an electrode of the semiconductor element, an alloy phase or a metal compound phase of the metal fine particles (M) included in the bonding film and the electrode is formed.

With regard to the bonded body of a semiconductor and a substrate, it is preferable that the porosity of the porous metal body is 1% to 6% by volume, and the average pore diameter is 10 to 60 nm.

Furthermore, in order to solve the above-described problems, a pasted body according to the invention is a pasted body having pasted together a tacky adhesive film having a base material film and a tacky adhesive layer provided on the base material film; a bonding film for bonding a semiconductor element and a substrate; and a semiconductor wafer, wherein the bonding film has an electroconductive bonding layer formed by molding an electroconductive paste including metal fine particles (P) into a film form; and a tack layer having tackiness and laminated on the electroconductive bonding layer, the electroconductive bonding layer is pasted to the tacky adhesive layer, the semiconductor wafer is pasted to the tack layer, the tack layer is thermally decomposable and includes 0.1% to 1.0% by weight of metal fine particles (M) with respect to the metal fine particles (P) in the electroconductive bonding layer, and after the tack layer is thermally decomposed by heating at the time of bonding and the metal fine particles (M) melt and react with an electrode of the semiconductor element, the metal fine particles (P) of the electroconductive bonding layer are sintered to bond the semiconductor element and the substrate.

Effect of the Invention

According to the invention, a bonding film that has sufficient connection heat resistance and high reliability, enables satisfactory bonding to a substrate irrespective of the type of the electrode of the semiconductor element, and makes a bonding step simple and easy; a tape for wafer processing; a method for producing a bonded body; a bonded body; and a pasted body, can be provided.

MODE(S) FOR CARRYING OUT THE INVENTION

Figure 1:
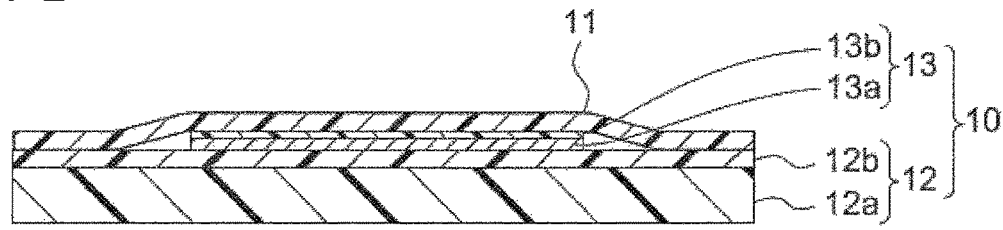
FIG. 1 is a cross-sectional view schematically illustrating a tape for wafer processing according to embodiments of the invention.
Figure 2:
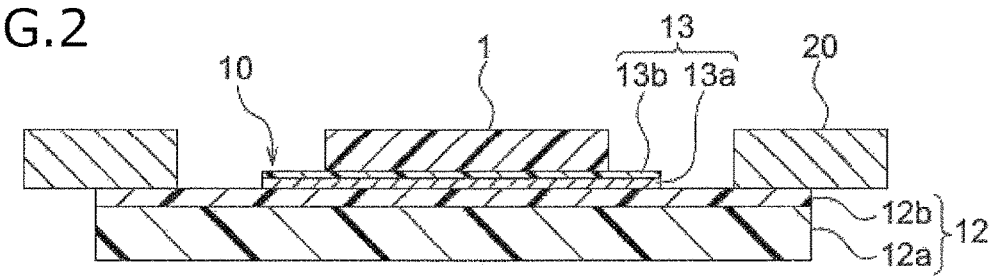
FIG. 2 is a diagram of a semiconductor wafer pasted on a tape for wafer processing.
Figure 3:
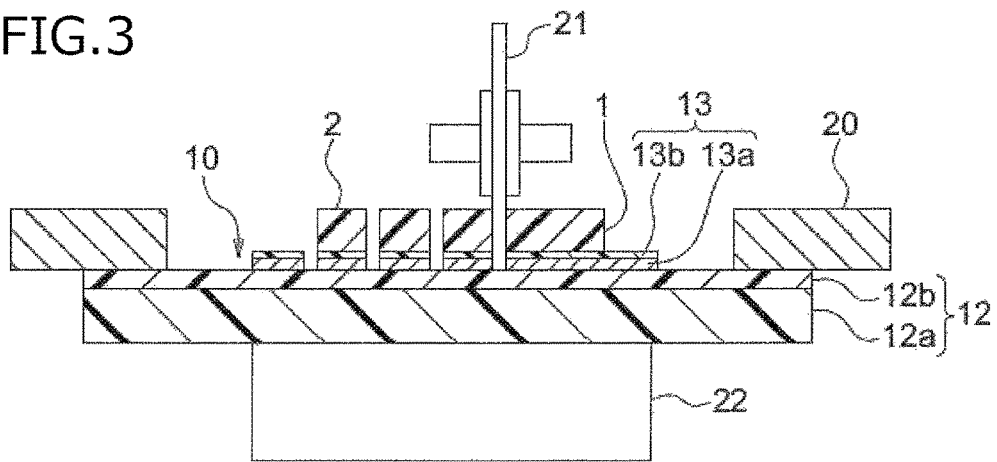
FIG. 3 is a diagram for describing a dicing step.
Figure 4:
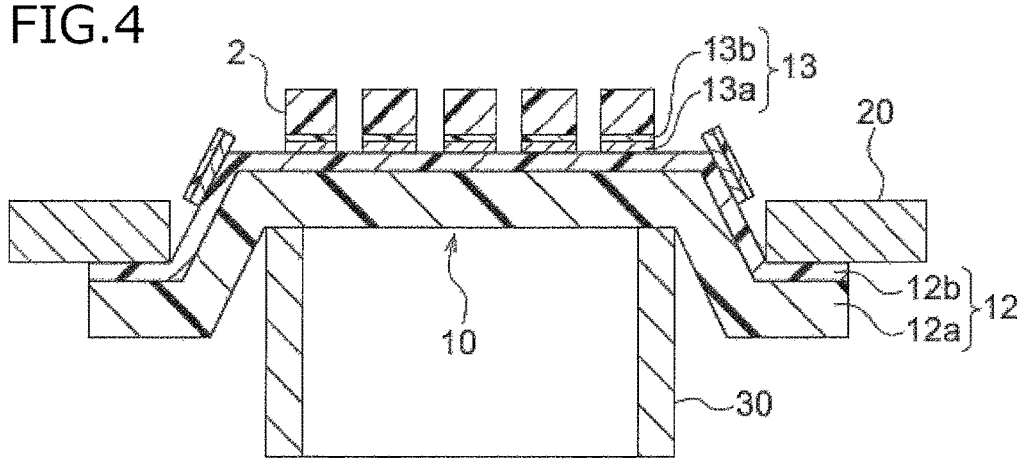
FIG. 4 is a diagram for describing an expansion step.
Figure 5:
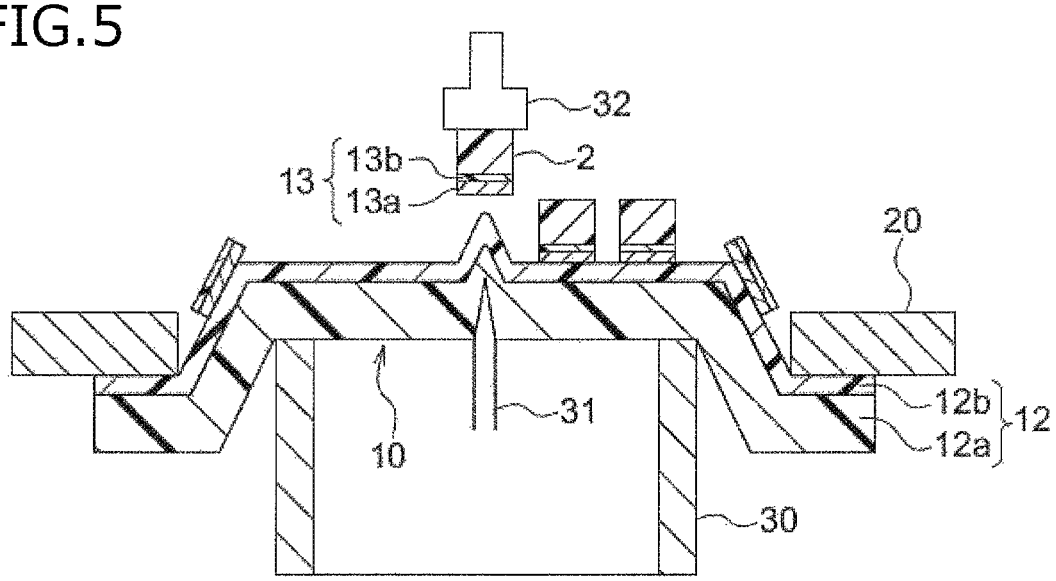
FIG. 5 is a diagram for describing a pickup step.
Figure 6:
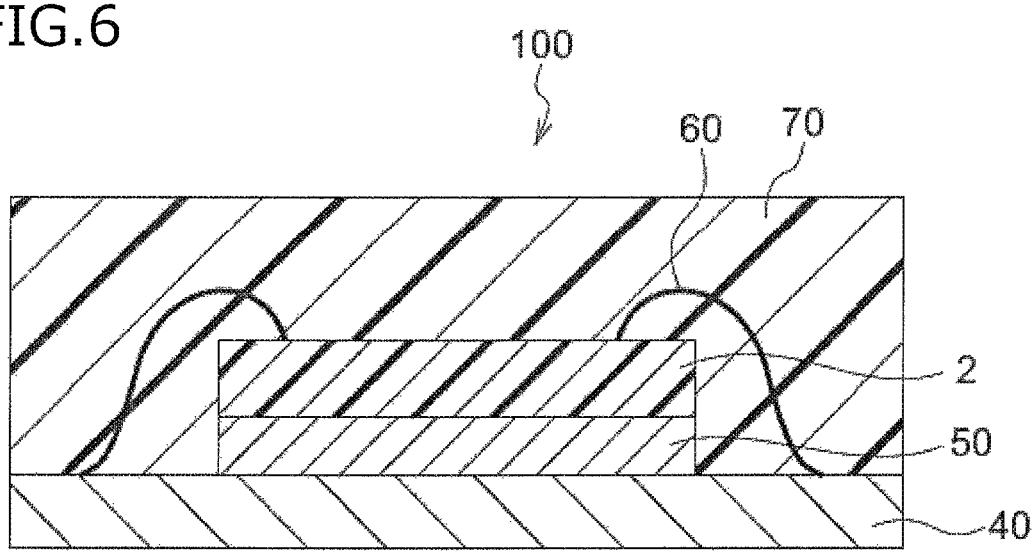
FIG. 6 is a cross-sectional view schematically illustrating a semiconductor device produced using the tape for wafer processing according to the embodiments of the invention.

An adhesive film and a tape for wafer processing according to embodiments of the invention will be described below based on the drawings. The tape for wafer processing according to an embodiment of the invention will be described based on FIG. 1 to FIG. 5. FIG. 1 is a cross-sectional view illustrating a tape for wafer processing 10 according to an embodiment. FIG. 2 is a diagram showing the state in which a semiconductor wafer 1 is pasted on the tape for wafer processing 10. FIG. 3 is a diagram for describing a dicing step in a semiconductor device production process, FIG. 4 is a diagram for describing an expansion step, and FIG. 5 is a diagram for describing a pickup step. FIG. 6 is a cross-sectional view schematically illustrating a semiconductor device produced using the tape for wafer processing according to the embodiments of the invention.

As shown in FIG. 1, the tape for wafer processing 10 according to an embodiment of the invention has a tacky adhesive film 12 composed of abase material film 12a and a tacky adhesive layer 12b formed thereon; and a bonding film 13 laminated on this tacky adhesive film 12. The bonding film 13 has an electroconductive bonding layer 13a formed by molding an electroconductive paste including metal fine particles (P) into a film form; and a tack layer 13b having tackiness and laminated on the electroconductive bonding layer 13a, and the electroconductive bonding layer 13a is provided on the tacky adhesive layer 12b. The tape for wafer processing 10 is used for both steps of a dicing step of cutting a semiconductor wafer 1 into semiconductor elements 2 (also referred to as chips or semiconductor chips) and a die-bonding step of bonding the cut semiconductor elements 2 to substrates 40 such as a circuit substrate, a ceramic substrate, and a lead frame (see FIG. 6). The dicing step will be described below with reference to FIG. 3.

The tacky adhesive layer 12b may be composed of a tacky adhesive layer or may be composed of a laminate of two or more tacky adhesive layers. Incidentally, FIG. 1 shows a state in which a release film 11 is provided on the tape for wafer processing 10 in order to protect the bonding film 13. Regarding the release film 11, any known release film can be used.

The tacky adhesive film 12 and the bonding film 13 may be formed in advance into a predetermined shape in accordance with the step or device used.

Hereinafter, each of the constituent elements of the tape for wafer processing 10 of the present embodiment will be described in detail.
(Bonding Film)

With regard to the bonding film 13, when the semiconductor wafer 1 is pasted to the bonding film 13 and diced, and then individualized semiconductor elements 2 are picked up, the bonding film 13 is peeled off from the tacky adhesive film 12, adheres to the semiconductor elements 2, and is picked up, and the bonding film 13 is used as a bonding material at the time of fixing the semiconductor elements 2 to a substrate 40. Therefore, the bonding film 13 has tacky adhesiveness and peelability, by which the bonding film 13 can be peeled from the tacky adhesive film 12 in a state of being adhered to a individualized semiconductor element 2 in the pickup step, and the bonding film 13 bonds the semiconductor element 2 and the substrate 40 to have sufficient bonding reliability. The pickup step will be described below with reference to FIG. 5.

The bonding film 13 has an electroconductive bonding layer 13a formed by molding an electroconductive paste including metal fine particles (P) into a film form, and a tack layer 13b having tackiness and laminated on the electroconductive bonding layer 13a.

Incidentally, the term tackiness according to the invention means adhesiveness, and specifically, tackiness means adhesiveness by which the electroconductive bonding layer 13a can be retained on the semiconductor wafer 1 or the semiconductor element 2.

[Electroconductive Bonding Layer]

It is preferable that the electroconductive paste includes an organic dispersion medium (D), in addition to including metal fine particles (P).

Regarding the metal fine particles (P) included in the electroconductive paste (also referred to as "metal fine particles in electroconductive bonding layer"), one kind of fine particles selected from the metal element group consisting of copper, magnesium, aluminum, zinc, gallium, titanium, manganese, germanium, silver, gold, nickel, platinum, and palladium; fine particles obtained by mixing two or more kinds selected from the above-described metal element group; fine particles formed from an alloy of two or more kinds of elements selected from the above-described metal element group; fine particles obtained by mixing one kind of fine particles selected from the above-described metal element group or a mixture of two or more kinds of fine particles selected from the above-described metal element group, with fine particles formed from an alloy of two or more kinds of elements selected from the above-described metal element group; oxides of these, hydroxides of these, or the like can be used.

With regard to the metal fine particles (P), when electrical conductivity and sinterability at the time of performing a heating treatment are considered, it is preferable to use metal fine particles including (i) copper fine particles (P1) or (ii) 90% to 100% by mass of copper fine particles (P1) and 10% to 0% by mass of one kind or two or more kinds of second metal fine particles (P2) selected from magnesium, aluminum, zinc, gallium, titanium, manganese, and germanium. The copper fine particles (P1) are made of a relatively highly electroconductive metal, while the metal fine particles (P2) are made of a metal having a relatively low melting point. When the copper fine particles (P1) are used in combination with the second metal fine particles (P2), it is preferable that the metal fine particles (P2) form an alloy with the copper fine particles (P1) among the metal fine particles (P), or the metal fine particles (P2) form a coating layer on the surface of the copper fine particles (P1) among the metal fine particles (P). When the copper fine particles (P1) and the metal fine particles (P2) are used in combination, the heating treatment temperature can be lowered, and binding between the metal fine particles can be made easier.

Regarding the metal fine particles (P), the average primary particle size before a heating treatment is preferably 10 to 500 nm, more preferably 30 to 300 nm, and even more preferably 100 to 150 nm. When the average primary particle size of the metal fine particles (P) is less than 10 nm, there is concern that it may be difficult to form a homogeneous particle size and pores over the entirety of the sintered body by a heating treatment (sintering), the thermal cycle characteristics may be deteriorated, and the bonding strength may also be deteriorated. On the other hand, when the average primary particle size is larger than 500 nm, the metal fine particles constituting the sintered body and the pore diameter acquire sizes in the order of micrometers, and the thermal cycle characteristics are also deteriorated. Regarding the average primary particle size of the metal fine particles (P) before a heating treatment, the diameter can be measured using a scanning electron microscope (SEM). For example, when the two-dimensional shape is an approximately circular shape, the diameter of the circle is measured; in the case of an approximately elliptical shape, the minor axis of the ellipse is measured; in the case of an approximately square shape, the length of a side of the square is measured; and in the case of an approximately rectangular shape, the length of a short side of the rectangle is measured. The "average primary particle size" can be determined by observing a plurality of particles, such as 10 to 20 particles, which have been randomly selected with the above-described microscope, measuring the particle sizes and calculating the average value of the particle sizes.

The method for producing the metal fine particles (P) is not particularly limited, and for example, methods such as a wet chemical reduction method, an atomization method, a plating method, a plasma CVD method, and an MOCVD method can be used.

Regarding the method for producing metal fine particles (P) having an average primary particle size of 10 to 500 nm, specifically the method disclosed in JP 2008-231564 A can be employed. When the production method disclosed in this publication is employed, metal fine particles (P) having an average primary particle size of 10 to 500 nm can be easily obtained, and the electroconductive paste of the invention can be produced by adding an organic dispersion medium (D) to metal fine particles that are collected after completion of a reduction reaction of metal ions by adding an aggregating agent to a reduction reaction aqueous solution and collected by centrifugation or the like, impurities having been removed from the reaction liquid, in the method for producing metal fine particles disclosed in this publication, and kneading the mixture.

In order to uniformly disperse the metal fine particles (P) in the electroconductive paste, it is important to select a particular organic dispersion medium (D) having excellent dispersibility, sinterability at the time of heating treatment, and the like. The organic dispersion medium (D) can disperse the metal fine particles (P) in the electroconductive paste, regulate the viscosity of the electroconductive paste to maintain a film shape, and exhibit functions as a reducing agent in a liquid form and a gas form during a heating treatment. The organic dispersion medium (D) includes at least an organic solvent (S), and it is preferable that the organic dispersion medium (D) further includes an organic binder (R).

It is preferable that the organic solvent (S) includes an organic solvent (SC) formed from an alcohol and/or polyhydric alcohol having a boiling point at normal pressure of 100° C. or higher and having one or two or more hydroxyl groups in the molecule. Furthermore, it is preferable that the organic solvent (S) is one selected from: (i) an organic solvent (S1) including, at least, 5% to 90% by volume of an organic solvent (SA) having an amide group, 5% to 45% by volume of a low-boiling point organic solvent (SB) having a boiling point at normal pressure of 20° C. to 100° C., and 5% to 90% by volume of an organic solvent (SC) formed from an alcohol and/or polyhydric alcohol having a boiling point at normal pressure of 100° C. or higher and having one or two or more hydroxyl groups in the molecule; and (ii) an organic solvent (S2) including, at least, 5% to 95% by volume of an organic solvent (SA) having an amide group, and 5% to 95% by volume of an organic solvent (SC) formed from an alcohol and/or polyhydric alcohol having a boiling point at normal pressure of 100° C. or higher and having one or two or more hydroxyl groups in the molecule.

When organic solvent components other than those described above are blended in, a polar organic solvent such as tetrahydrofuran, diglyme, ethylene carbonate, propylene carbonate, sulfolane, or dimethyl sulfoxide can be used.

The organic solvent (S1) is an organic solvent including, at least, 5% to 90% by volume of an organic solvent (SA) having an amide group, 5% to 45% by volume of a low-boiling point organic solvent (SB) having a boiling point at normal pressure of 20° C. to 100° C., and 5% to 90% by volume of an organic solvent (SC) formed from an alcohol and/or polyhydric alcohol having a boiling point at normal pressure of 100° C. or higher and having one or two or more hydroxyl groups in the molecule. The amount of the organic solvent (SA) included in the organic solvent (S1) is 5% to 90% by volume, and the organic solvent (SA) has an action of enhancing dispersibility and storage stability in the electroconductive paste and enhancing the close adhesiveness at a bonding surface when the electroconductive bonding layer of the bonding surface is heat-treated to form a sintered body. The amount of the organic solvent (SB) included in the organic solvent (S1) is 5% to 45% by volume or more, and the organic solvent (SB) has an action of lowering an interaction between the solvent molecules in the electroconductive paste and enhancing the affinity of the dispersed metal fine particles (P) to the organic solvent (S1). The amount of the organic solvent (SC) included in the organic solvent (S1) is 5% to 90% by volume or more, and the organic solvent (SC) enables promotion of dispersibility in the electroconductive paste and further long-term stabilization of dispersibility. Furthermore, when the organic solvent (SC) is caused to be present in a mixed organic solvent, in a case where the electroconductive bonding layer is disposed at the bonding surface and is subjected to a heating treatment, uniformity of the sintered body is enhanced, the effect of the organic solvent (SC) on accelerating reduction of the oxide coating film is also exhibited, and a bonding member having high electrical conductivity can be obtained. The phrase "the organic solvent (S1) is an organic solvent including, at least, 5% to 90% by volume of the organic solvent (SA), 5% to 45% by volume of the organic solvent (SB), and 5% to 90% by volume of the organic solvent (SC)" implies that the organic solvent (S1) may have the organic solvent (SA), the organic solvent (SB), and the organic solvent (SC) blended together such that the blending proportions make up 100% by volume, and that other organic solvent components may also be blended within the range of the above-described blending proportions and to the extent that does not impair the effect of the present invention; however, in this case, it is preferable that 90% by volume or more, and more preferably 95% by volume or more, of components composed of the organic solvent (SA), the organic solvent (SB), and the organic solvent (SC) are included. Preferable blending proportions are 5% to 70% by volume of the organic solvent (SA), 5% to 30% by volume of the organic solvent (SB), and 10% to 90% by volume of the organic solvent (SC).

The organic solvent (S2) is an organic solvent including, at least, 5% to 95% by volume of an organic solvent (SA) having an amide group, and 5% to 95% by volume of an organic solvent (SC) formed from an alcohol and/or polyhydric alcohol having a boiling point at normal pressure of 100° C. or higher and having one or two or more hydroxyl groups in the molecule. The amount of the organic solvent (SA) included in the organic solvent (S2) is 5% to 95% by volume, and the organic solvent (SA) has an action of enhancing dispersibility and storage stability in the mixed organic solvent and enhancing close adhesiveness at a bonding surface at the time of heat-treating the electroconductive paste and forming a porous metal body. The amount of the organic solvent (SC) included in the organic solvent (S2) is 5% to 95% by volume, and the organic solvent (SC) further enhances dispersibility in the electroconductive paste. When the organic solvent (SA) and the organic solvent (SC) are caused to be present in the organic solvent (S2), in a case where the electroconductive bonding layer is disposed at a bonding surface and then subjected to a heating treatment, sintering can be carried out even at a relatively low heating treatment temperature. The phrase "organic solvent (S2) is an organic solvent including, at least, 5% to 95% by volume of the organic solvent (SA) and 5% to 95% by volume of the organic solvent (SC)" implies that the organic solvent (S2) may have the organic solvent (SA) and the organic solvent (SC) blended together such that the blending proportions make up 100% by volume, and that other organic solvent components may also be blended within the range of the above-described blending proportions and to the extent that does not impair the effect of the present invention; however, in this case, it is preferable that 90% by volume or more, and more preferably 95% by volume or more, of components composed of the organic solvent (SA) and the organic solvent (SC) are included. Preferable blending proportions are 5% to 80% by volume of the organic solvent (SA) and 10% to 90% by volume of the organic solvent (SC).

Specific examples of the above-described organic solvent (SC), organic solvent (SA), and organic solvent (SB) will be shown below.

The organic solvent (SC) is an organic compound that has a boiling point at normal pressure of 100° C. or higher, is formed from an alcohol and/or polyhydric alcohol having one or two or more hydroxyl groups in the molecule, and has reducing properties. Furthermore, an alcohol having 5 or more carbon atoms and a polyhydric alcohol having 2 or more carbon atoms are preferred, and an alcohol or polyhydric alcohol that is liquid at normal temperature and has a high relative dielectric constant, for example, a relative dielectric constant of 10 or greater, is preferred. With regard to the metal fine particles (P) having an average primary particle size of 10 to 500 nm, since the surface area of the fine particles is large, it is necessary to consider the influence of oxidation; however, since the organic solvents (SC) listed below exhibit functions as reducing agents in a liquid form and a gas form during a heating treatment (sintering), the organic solvents (SC) suppress oxidation of the metal fine particles (P) and accelerate sintering during a heating treatment. Specific examples of the organic solvent (SC) include ethylene glycol, diethylene glycol, 1,2-propanediol, 1,3-propanediol, 1,2-butanediol, 1,3-butanediol, 1,4-butanediol, 2-butene-1,4-diol, 2,3-butanediol, pentanediol, hexanediol, octanediol, glycerol, 1,1,1-trishydroxymethylethane, 2-ethyl-2-hydroxymethyl-1,3-propanediol, 1,2,6-hexanetriol, 1,2,3-hexanetriol, and 1,2,4-butanetriol.

Furthermore, as specific examples of the organic solvent (SC), sugar alcohols such as threitol (D-Threitol), Erythritol, Pentaerythritol, Pentitol, and Hexitol can also be used, and examples of the pentitol include Xylitol, Ribitol, and Arabitol. Examples of the hexitol include Mannitol, Sorbitol, and Dulcitol. Furthermore, saccharides such as Glyceric aldehyde, Dioxy-acetone, threose, Erythrulose, Erythrose, Arabinose, Ribose, Ribulose, Xylose, Xylulose, Lyxose, Glucose, Fructose, Mannose, Idose, Sorbose, Gulose, Talose, Tagatose, Galactose, Allose, Altrose, Lactose, Isomaltose, Gluco-heptose, Heptose, Maltotriose, Lactulose, and Trehalose can also be used; however, those having high melting points can be used as mixtures with other organic solvents (SC) having lower melting points. Among the above-described alcohols, a polyhydric alcohol having two or more hydroxyl groups in the molecule is more preferred, and ethylene glycol and glycerol are particularly preferred.

The organic solvent (SA) is a compound having an amide group (—CONH—), and particularly a compound having a high relative dielectric constant is preferred. Examples of the organic solvent (A) include N-methylacetamide (191.3 at 32° C.), N-methylformamide (182.4 at 25° C.), N-methylpropanamide (172.2 at 25° C.), formamide (111.0 at 20° C.), N,N-dimethylacetamide (37.78 at 25° C.), 1,3-dimethyl-2-imidazolidinone (37.6 at 25° C.), N,N-dimethylformamide (36.7 at 25° C.), 1-methyl-2-pyrrolidone (32.58 at 25° C.), hexamethylphosphoric triamide (29.0 at 20° C.), 2-pyrrolidinone, ε-caprolactam, and acetamide; however, these can also be used as mixtures. Incidentally, the number in the parentheses after the name of the compound having an amide group represents the relative dielectric constant of each solvent at the measurement temperature. Among these, N-methylacetamide, N-methylformamide, N-methylpropanamide, formamide, and the like, which have relative dielectric constants at a measurement temperature of 20° C. to 32° C. of 100 or greater, can be suitably used. Incidentally, the measurement temperature range 20° C. to 32° C. corresponds to a processing temperature for paste preparation and film preparation, and when the relative dielectric constant at that time is 100 or greater, aggregation of the metal fine particles (P) in a paste preparation step before film preparation is suppressed, and film processability is enhanced, so that the measurement temperature range becomes an important temperature range. Incidentally, in the case of a solid at normal temperature, such as N-methylacetamide (melting point: 26° C. to 28° C.), the organic solvent can be mixed with another solvent and used in a liquid form at the treatment temperature.

The organic solvent (SB) is an organic compound having a boiling point at normal pressure in the range of 20° C. to 100° C., and preferably in the range of 60.0° C. to 100° C. In a case where the boiling point at normal pressure is lower than 20° C., when a particle dispersion liquid including the organic solvent (SB) is stored at normal temperature, there is a risk that the component of the organic solvent (SB) may be volatilized, and the paste composition may be changed. Furthermore, when the boiling point at normal pressure is 100° C. or lower, it can be expected that the mutual attraction between solvent molecules caused by addition of the solvent is lowered, and the effect of further enhancing the dispersibility of the fine particles is effectively exhibited. Furthermore, when the boiling point at normal pressure is 60° C. or higher, it is preferable because production can be stably achieved even without cooling during kneading. Examples of the organic solvent (SB) include an ether-based compound (SB1) represented by General Formula: R1-O—R2 (wherein R1 and R2 each independently represent an alkyl group having 1 to 4 carbon atoms), an alcohol (SB2) represented by General Formula: R3-OH (wherein R3 represents an alkyl group having 1 to 4 carbon atoms), a ketone-based compound (SB3) represented by General Formula: R4-C(=O)—R5 (wherein R4 and R5 each independently represent an alkyl group having 1 or 2 carbon atoms), and an amine-based compound (SB4) represented by General Formula: R6-(N—R7)-R8 (wherein R6, R7, and R8 each independently represent an alkyl group or a hydrogen atom, each having 0 to 2 carbon atoms).

Examples of the organic solvent (SB) will be listed below, and the number in the parentheses after a compound name represents the boiling point at normal pressure. Examples of the ether-based compound (SB1) include diethyl ether (35° C.), methyl propyl ether (31° C.), dipropyl ether (89° C.), diisopropyl ether (68° C.), methyl-t-butyl ether (55.3° C.), t-amyl methyl ether (85° C.), divinyl ether (28.5° C.), ethyl vinyl ether (36° C.), and allyl ether (94° C.). Examples of the alcohol (SB2) include methanol (64.7° C.), ethanol (78.0° C.), 1-propanol (97.15° C.), 2-propanol (82.4° C.), 2-butanol (100° C.), and 2-methyl-2-propanol (83° C.). Examples of the ketone-based compound (SB3) include acetone (56.5° C.), methyl ethyl ketone (79.5° C.), and diethyl ketone (100° C.). Examples of the amine-based compound (SB4) include triethylamine (89.7° C.) and diethylamine (55.5° C.)

The organic binder (R) exhibits functions of suppressing aggregation of the metal fine particles (P) in the electroconductive paste, regulating the viscosity of the electroconductive paste, and maintaining the shape of an electroconductive connection member precursor. The organic binder (R) is preferably one kind or two or more kinds selected from a cellulose resin-based binder, an acetate resin-based binder, an acrylic resin-based binder, a urethane resin-based binder, a polyvinylpyrrolidone resin-based binder, a polyamide resin-based binder, a butyral resin-based binder, and a terpene-based binder. Specifically, it is preferable that the cellulose resin-based binder is one kind or two or more kinds selected from acetyl cellulose, methyl cellulose, ethyl cellulose, butyl cellulose, and nitrocellulose; the acetate resin-based binder is one kind or two or more kinds selected from methyl glycol acetate, ethyl glycol acetate, butyl glycol acetate, ethyl diglycol acetate, and butyl diglycol acetate; the acrylic resin-based binder is one kind or two or more kinds selected from methyl methacrylate, ethyl methacrylate, and butyl methacrylate; the urethane resin-based binder is one kind or two or more kinds selected from 2,4-tolylene diisocyanate and p-phenylene diisocyanate; the polyvinylpyrrolidone resin-based binder is one kind or two or more kinds selected from polyvinylpyrrolidone and N-vinylpyrrolidone; the polyamide resin-based binder is one kind or two or more kinds selected from polyamide 6, polyamide 66, and polyamide 11; the butyral resin-based binder is one kind or two or more kinds selected from polyvinylbutyral; and the terpene-based binder is one kind or two or more kinds selected from pinene, cineole, limonene, and terpineol.

The electroconductive paste is an electroconductive paste including metal fine particles (P) and an organic dispersion medium (D) formed from an organic solvent (S), or an electroconductive paste including the metal fine particles (P) and an organic dispersion medium (D) formed from an organic solvent (S) and an organic binder (R). When this is subjected to a heating treatment, the electroconductive paste functions as a bonding material by utilizing the principle that when a certain temperature is reached, evaporation of the organic solvent (S), or evaporation of the organic solvent (S) and thermal degradation of the organic binder (R) proceed so that the surfaces of the metal fine particles (P) are exposed, and the metal fine particles are bound to each other at the surface (sintered). The blending proportions (P/D) of the metal fine particles (P) and the organic dispersion medium (D) in the electroconductive paste are preferably 50% to 85% by mass/50% to 15% by mass (the sum of percent (%) by mass is 100% by mass). Furthermore, metal fine particles, organic dispersion medium, and the like other than those mentioned above can be blended into the electroconductive paste of the invention, to the extent that does not impair the effects of the invention.

When the blending proportion of the metal fine particles (P) is more than 85% by mass as described above, the paste becomes highly viscous, and there is a risk that insufficient binding between the surfaces of the metal fine particles (P) may occur during a heating treatment so that electrical conductivity may be lowered. On the other hand, when the blending proportion of the metal fine particles (P) is less than 50% by mass as described above, the viscosity of the paste is lowered so that it is difficult to maintain the film shape, there is concern that a defect such as shrinkage may occur during a heating treatment, and further, there is also concern that inconveniences causing the rate of evaporation of the organic dispersion medium (D) to become slower may be accompanied when a heating treatment is performed. From such a viewpoint, the blending proportions (P/D) of the metal fine particles (P) and the organic dispersion medium (D) are more preferably 55% to 80% by mass/45% to 20% by mass. Furthermore, the blending proportions (S/R) of the organic solvent (S) and the organic binder (R) in the organic dispersion medium (D) are preferably 80% to 100% by mass/20% to 0% by mass (the sums of percent (%) by mass are all 100% by mass), and more preferably 85% to 95% by mass/15% to 5% by mass.

In a case where the blending proportion of the organic binder (R) in the organic dispersion medium (D) is more than 20% by mass, when the electroconductive bonding layer 13a is subjected to a heating treatment, the rate at which the organic binder (R) is thermally decomposed and flies apart in all directions is slowed, and when the amount of residual carbon in the electroconductive connection member increases, sintering is inhibited, and there is a possibility that problems such as cracking and peeling may occur, which is not preferable. In a case where the organic solvent (S) is selected to cause the metal fine particles (P) to be uniformly dispersed only by the solvent, and the functions capable of regulating the viscosity of the electroconductive paste and maintaining the film shape can be exhibited, a component composed only of the organic solvent (S) can be used as the organic dispersion medium (D). In the electroconductive paste, known additives such as an antifoaming agent, a dispersant, a plasticizer, a surfactant, and a thickening agent can be added to the above-described components as necessary. When the electroconductive paste is produced, the various components can be mixed and then kneaded using a ball mill or the like.

[Tack Layer]

The tack layer 13b is intended to retain the electroconductive bonding layer 13a on the semiconductor wafer 1 or the semiconductor element 2 and has tackiness. Furthermore, the tack layer 13b is thermally decomposed by the heating at the time of bonding the semiconductor element 2 and a substrate 40. The tack layer 13b is not particularly limited as long as the tack layer has such properties and may be composed of any kind of layer.

Since the electroconductive bonding layer 13a lacks tackiness, the tack layer 13b is a layer for improving the adhesiveness between the semiconductor wafer 1 or the semiconductor element 2 and the electroconductive bonding layer 13a. When the tack layer 13b is absent, since the adhesive force between the semiconductor wafer 1 or the semiconductor element 2 and the electroconductive bonding layer 13a is weak, at the time of dicing the semiconductor wafer 1 or picking up the semiconductor element 2, peeling occurs between the semiconductor wafer 1 or the semiconductor element 2 and the electroconductive bonding layer 13a. Furthermore, the tack layer 13b is also a layer for increasing the close adhesive force of the electroconductive bonding layer 13a to the semiconductor wafer 1 or the semiconductor element 2. As the close adhesive force increases, the bonding strength at the time of bonding the semiconductor element 2 and the substrate 40, with the electroconductive bonding layer 13a interposed therebetween, is also enhanced.

According to the invention, it is important that as the tack layer 13b is thermally decomposed by the heating at the time of bonding the semiconductor element 2 and the substrate 40, the semiconductor element 2 and the substrate 40 are mechanically bonded, with the electroconductive bonding layer 13a interposed therebetween. For this reason, the tack layer 13b is preferably such that the weight reduction in the thermogravimetric measurement at the heating temperature during bonding, in an air atmosphere, at a rate of temperature increase of 5° C./min is 70% by weight or more, even more preferably 85% by weight or more, or still more preferably 95% by weight or more.

Furthermore, since the tack layer 13b is in direct contact with the semiconductor element 2 at the time of bonding, an effect of activating the surface of an electrode of the semiconductor element 2 is also expected. This is considered to be because when the substance included in the tack layer 13b is degraded during heating, the substance reacts with an oxide layer of the electrode surface, which is a metal, and cleans the metal surface. As such, as the surface of the electrode of the semiconductor element 2 is activated, the close adhesive force between the electrode of the semiconductor element 2 and the electroconductive bonding layer 13a can be enhanced.

Regarding the material constituting the tack layer 13b, it is preferable to use a material that does not dissolve in a polar or non-polar solvent at room temperature but easily dissolves when heated to the melting point. When such a material is heated to the melting point, dissolved in a solvent, applied on the electroconductive bonding layer 13a, and then cooled to room temperature, and the solvent is evaporated, a film-like body having tackiness can be formed. Regarding the solvent, any known solvent can be appropriately used; however, it is preferable to use a low-boiling point solvent in order to facilitate evaporation during film forming. As the low-boiling point solvent, the organic solvent (SB) may also be used.

Furthermore, it is more preferable that the tack layer 13b is composed of a substance that reduces the metal fine particles (P) when the metal fine particles (P) in the electroconductive paste are heated and sintered. With regard to a substance with which a thermal decomposition reaction of the tack layer 13b occurs as a multi-stage reaction, the reaction temperature region is wide, the metal fine particles (P) are reduced, and thereby the resistivity after sintering of the metal fine particles (P) is decreased, so that the electrical conductivity is enhanced.

It is preferable that the tack layer 13b is formed from, for example, one kind or two or more kinds selected from polyglycerin (melting point: 23° C.); glycerin fatty acid esters such as glycerin monocaprate (melting point: 46° C.), glycerin monolaurate (melting point: 57° C.), glycerin monostearate (melting point: 70° C.), and glycerin monobehenate (melting point: 85° C.); polyglycerin fatty acid esters such as diglycerin stearate (melting point: 61° C.) and diglycerin laurate (melting point: 34° C.); phosphines such as styrene-p-styryldiphenylphosphine (melting point: 75° C.), triphenylphosphine (melting point: 81° C.), and tri-n-octylphosphine (melting point: 30° C.); phosphites; sulfides such as bis(4-methacryloylthiophenyl) sulfide (melting point: 64° C.), phenyl p-tolyl sulfide (melting point: 23° C.), and furfuryl sulfide (melting point: 32° C.); disulfides such as diphenyl disulfide (melting point: 61° C.), benzyl disulfide (melting point: 72° C.), and tetraethylthiuram disulfide (melting point: 70° C.): trisulfides; and sulfoxides.

Furthermore, known additives such as an antifoaming agent, a dispersant, a plasticizer, a surfactant, and a thickening agent can be added as necessary to the tack layer 13b, to the extent that does not inhibit tackiness and thermal degradability and does not cause a problem in view of contamination of the semiconductor element 2 or the substrate 40 and bumping gas generation.

The tack layer 13b includes 0.1% to 1.0% by mass of metal fine particles (M) (also referred to as "metal fine particles in the tack layer") with respect to the metal fine particles (P) in the electroconductive bonding layer 13a. The metal fine particles (M) have a melting point of 250° C. or lower. The metal fine particles (M) are preferably fine particles of tin or an alloy thereof, and for example, a powder of Sn solder, or a powder of SnNiCu, SnNiCu(Ge), SnAgCu, or SnAu can be used. By adding 0.1% to 1.0% by mass of the metal fine particles (M) to the tack layer 13b with respect to the metal fine particles (P) in the electroconductive bonding layer 13a, the tack layer 13b is thermally decomposed by the heat at the time of bonding, the metal fine particles (M) melt to undergo diffusional reaction with an electrode of the semiconductor element and form an alloyed phase or a metal compound phase (hereinafter, also referred to as diffusion layer), so that the bondability between the electroconductive bonding layer 13a and the electrode of the semiconductor element 2 is improved, and bonding can be satisfactorily achieved irrespective of the type of the metal fine particles (P) constituting the electroconductive bonding layer 13a or the type of the electrode.

With regard to the metal fine particles (M), the average primary particle size is preferably 1 to 3 μm, and in order to further reduce the thickness of the diffusive phase to be formed, the average primary particle size is more preferably 1 to 2 μm. When the average primary particle size of the metal fine particles (M) is less than 1 μm, sintering begins from a low temperature due to a size effect, the particle size becomes large or a variation of the particle size occurs from the initial stage of sintering, and there is a risk that the diffusion reaction with the electrode may deteriorate, or a variation of the diffusive phase may occur. Furthermore, when the average primary particle size is greater than 3 μm, there is a risk that a diffusive phase resulting from a diffusion reaction may become thick and may inhibit the electrical conductivity and heat dissipation of the bonded body. Regarding the average primary particle size of the metal fine particles (M), the diameter can be measured using a scanning electron microscope (SEM). For example, when the two-dimensional shape is an approximately circular shape, the diameter of the circle is measured; in the case of an approximately elliptical shape, the minor axis of the ellipse is measured; in the case of an approximately square shape, the length of a side of the square is measured; and in the case of an approximately rectangular shape, the length of a short side of the rectangle is measured. The "average primary particle size" can be determined by measuring the particle sizes of a plurality of particles, such as 10 to 20 particles, which have been randomly selected, by observing the particles with the above-described microscope, and calculating the average value of the particle sizes.

Next, a method for producing the bonding film 13 will be described. First, a release film is placed on a placement stand, and a spacer is disposed on the release film. The spacer is, for example, a plate made of a metal such as SUS and has a circular opening at the central part. The above-mentioned electroconductive paste is disposed at the opening of the spacer and on the release film, screen printing is performed using a squeegee to uniformly roll the electroconductive paste, and thereby the electroconductive paste is molded into a circular film form. Subsequently, the release film and the spacer are removed. Then, the electroconductive paste molded into a circular film form is preliminarily dried, and thereby the electroconductive bonding layer 13a is formed. The time for preliminary drying varies depending on the print thickness; however, the time can be set to, for example, 5 to 20 minutes.

Subsequently, the materials of the constituent components of the above-mentioned tack layer 13b are heated and kneaded in a solvent, and the resulting mixture is applied on the electroconductive bonding layer 13a using a squeegee method, a spray coating method, or the like and is cooled. Subsequently, the mixture is heated and dried to evaporate the solvent, and thereby the tack layer 13b is formed.

Meanwhile, according to the present embodiment, the bonding film 13 of the invention is provided on the tacky adhesive film 12 to constitute the tape for wafer processing 10 as a whole; however, the simple material of the bonding film 13 may be dealt with as the material for producing the tape for wafer processing 10, and in that case, it is preferable that the bonding film 13 has both surfaces protected by a protective film. As the protective film, known films such as a polyethylene-based film, a polystyrene-based film, a polyethylene terephthalate (PET)-based film, and in addition, a film that has been subjected to a mold release treatment, can be used; however, from the viewpoint of having a hardness suitable for retaining the bonding film 13, it is preferable to use a polyethylene film or a polystyrene film. The thickness of the protective film is not particularly limited and may be appropriately set; however, the thickness is preferably 10 to 300 μm.

(Tacky Adhesive Film)

The tacky adhesive film 12 has sufficient tacky adhesive force so that when the semiconductor wafer 1 is diced, the semiconductor wafer 1 retained on the bonding film 13 is not peeled, and the tacky adhesive film 12 has a low tacky adhesive force that allows the tacky adhesive film 12 to be easily peeled off from the bonding film 13 when semiconductor elements 2 that have been individualized after dicing are picked up. According to the present embodiment, regarding the tacky adhesive film 12, a product obtained by providing a tacky adhesive layer 12b on a base material film 12a as shown in FIG. 1 has been mentioned; however, the tacky adhesive film 12 is not limited to this, and any known tacky adhesive film used as a dicing tape can be used.

Regarding the base material film 12a of the tacky adhesive film 12, any conventionally known base material film can be used without particular limitation; however, as will be described below, according to the present embodiment, since a radiation-curable material among energy-curable materials is used as the tacky adhesive layer 12b, a material having radiolucency is used.

Examples of the material for the base material film 12a include homopolymers or copolymers of α-olefins, such as polyethylene, polypropylene, an ethylene-propylene copolymer, polybutene-1, poly-4-methylpentene-1, an ethylene-vinyl acetate copolymer, an ethylene-ethyl acrylate copolymer, an ethylene-methyl acrylate copolymer, an ethylene-acrylic acid copolymer, and an ionomer, or mixtures of these; polyurethane, a styrene-ethylene-butene copolymer, or a pentene-based copolymer; thermoplastic elastomers such as a polyamide-polyol copolymer; and mixtures of these. Furthermore, regarding the base material film 12a, a mixture of two or more kinds of materials selected from the group of these may be used, or these materials formed into a single layer or a multilayer may be used. The thickness of the base material film 12a is not particularly limited and may be appropriately set; however, the thickness is preferably 50 to 200 μm.

According to the present embodiment, since the tacky adhesive layer 12b is cured by irradiating the tacky adhesive film 12 with radiation such as ultraviolet radiation, and the tacky adhesive layer 12b is made easily peelable from the bonding film 13, for the resin of the tacky adhesive layer 12b, it is preferable to prepare a tacky adhesive by appropriately blending a radiation-polymerizable compound into a chlorinated polypropylene resin, an acrylic resin, a polyester resin, a polyurethane resin, an epoxy resin, an addition reaction-type organopolysiloxane-based resin, a silicone acrylate resin, an ethylene-vinyl acetate copolymer, an ethylene-ethyl acrylate copolymer, an ethylene-methyl acrylate copolymer, an ethylene-acrylic acid copolymer, various elastomers such as polyisoprene, a styrene-butadiene copolymer, and hydrogenation products thereof, or a mixture of those resins, all of which are known and are used for tacky adhesives. Furthermore, various surfactants and surface smoothing agents may also be added. The thickness of the tacky adhesive layer 12b is not particularly limited and may be appropriately set; however, the thickness is preferably 5 to 30 μm.

As the radiation-polymerizable compound, for example, a low-molecular weight compound having at least two or more photopolymerizable carbon-carbon double bonds in the molecule, which can be subjected to three-dimensional reticulation by light irradiation, or a polymer or oligomer having a photopolymerizable carbon-carbon double bond group as a substituent, is used. Specifically, trimethylolpropane triacrylate, pentaerythritol triacrylate, pentaerythritol tetraacrylate, dipentaerythritol monohydroxypentaacrylate, dipentaerythritol hexaacrylate, 1,4-butylene glycol diacrylate, 1,6-hexanediol diacrylate, polyethylene glycol diacrylate, oligoester acrylates, silicone acrylates, copolymers of acrylic acid and various acrylic acid esters, and the like can be applied.

Furthermore, in addition to the acrylate-based compounds such as described above, a urethane acrylate-based oligomer can also be used. A urethane acrylate-based oligomer is obtained by causing an isocyanate-terminated urethane prepolymer obtainable by reacting a polyol compound such as a polyester type or polyether type polyol with a polyvalent isocyanate compound (for example, 2,4-tolylene diisocyanate, 2,6-tolylene diisocyanate, 1,3-xylylene diisocyanate, 1,4-xylylene diisocyanate, or diphenylmethane 4,4-diisocyanate), to react with an acrylate or methacrylate having a hydroxyl group (for example, 2-hydroxyethyl acrylate, 2-hydroxyethyl methacrylate, 2-hydroxypropyl acrylate, 2-hydroxypropyl methacrylate, polyethylene glycol acrylate, or polyethylene glycol methacrylate). Incidentally, a mixture of two or more kinds selected from the above-described resins may also be used for the tacky adhesive layer 12b.

Incidentally, regarding the composition of the tacky adhesive layer 12b, a composition obtained by appropriately blending an acrylic tacky adhesive, a photopolymerization initiator, a curing agent, and the like in addition to the radiation-polymerizable compound that is cured when irradiated with radiation, can also be used.

In the case of using a photopolymerization initiator, for example, isopropyl benzoin ether, isobutyl benzoin ether, benzophenone, Michler's ketone, chlorothioxanthone, dodecylthioxanthone, dimethylthioxanthone, diethylthioxanthone, benzyl dimethyl ketal, α-hydroxycyclohexyl phenyl ketone, or 2-hydroxymethylphenylpropane can be used. The blending amount of these photopolymerization initiators is preferably 0.01 to 5 parts by mass with respect to 100 parts by mass of the acrylic copolymer.

The tacky adhesive film 12 can be produced by a method that is conventionally known as a method for producing a dicing tape. The tape for wafer processing 10 can be produced by pasting the electroconductive bonding layer 13a of the above-mentioned electroconductive bonding layer 13 on the tacky adhesive layer 12b of the tacky adhesive film 12.

(Method of Using Tape for Wafer Processing)

During the production process for the semiconductor device 100 (see FIG. 6), the tape for wafer processing 10 is used as follows. FIG. 2 shows the state in which a semiconductor wafer 1 and a ring frame 20 are stuck to the tape for wafer processing 10.

First, as shown in FIG. 2, the tacky adhesive layer 12b of the tacky adhesive film 12 is stuck to the ring frame 20, and the semiconductor wafer 1 is stuck together to the tack layer 13b of the bonding film 13. There is no limitation on the order of sticking these members, and it is also acceptable to stick together the semiconductor wafer 1 and the bonding film 13 and then to stick the tacky adhesive layer 12b of the tacky adhesive film 12 to the ring frame 20. Furthermore, sticking of the tacky adhesive film 12 to the ring frame 20 and sticking together of the semiconductor wafer 1 to the bonding film 13 may be simultaneously carried out.

Then, as shown in FIG. 3, a dicing step of the semiconductor wafer 1 is carried out, and then a step of irradiating the tacky adhesive film 12 with energy rays, for example, ultraviolet radiation, is carried out. Specifically, first, in order to dice the semiconductor wafer 1 and the bonding film 13 by means of a dicing blade 21, the tape for wafer processing 10 is supported by suction by means of a suction stage 22 from the tacky adhesive film 12 surface side. Then, the semiconductor wafer 1 and the bonding film 13 are cut and individualized into semiconductor element 2 units by means of a dicing blade 21, and then the semiconductor elements are irradiated with energy rays through the lower surface side of the tacky adhesive film 12. As a result of this irradiation with energy rays, the tacky adhesive layer 12b is cured, and the tacky adhesive force thereof is lowered. Incidentally, the tacky adhesive force of the tacky adhesive layer 12b of the tacky adhesive film 12 may be lowered by external stimulation such as heating, instead of irradiation with energy rays. When the tacky adhesive layer 12b is configured such that two or more layers of tacky adhesive layers are laminated, one layer or all layers of the tacky adhesive layers may be cured by irradiation with energy rays, and thereby the tacky adhesive force of one layer or all layers of the tacky adhesive layers may be lowered.

Subsequently, as shown in FIG. 4, an expansion step of stretching the tacky adhesive film 12 that retains diced semiconductor elements 2 and the bonding films 13 in the circumferential direction of the ring frame 20 is carried out. Specifically, a hollow cylindrical-shaped pressure member 30 is elevated from the lower surface side of the tacky adhesive film 12 against the tacky adhesive film 12 in a state of retaining a plurality of diced semiconductor elements 2 and bonding films 13, and the tacky adhesive film 12 is stretched in the circumferential direction of the ring frame 20.

After carrying out the expansion step, as shown in FIG. 5, a pickup step of picking up the semiconductor elements 2 is carried out in a state in which the tacky adhesive film 12 is expanded. Specifically, the semiconductor element 2 is thrusted by a pin 31 from the lower surface side of the tacky adhesive film 12, simultaneously the semiconductor element 2 is suctioned with a suction jig 32 from the top face side of the tacky adhesive film 12, and thereby individualized semiconductor elements 2 are picked up together with the bonding film 13.

Then, after carrying out the pickup step, a bonding step is carried out. Specifically, the electroconductive bonding layer 13a side of the bonding film 13 that has been picked up together with the semiconductor element 2 in the pickup step is disposed at the bonding position of a substrate 40 such as a lead frame or a package substrate. Subsequently, the bonding film 13 is subjected to a heating treatment at a temperature of 250° C. to 350° C. At this time, the tack layer 13b is thermally decomposed, simultaneously the organic dispersion medium (D) in the electroconductive bonding layer 13a is removed, the metal fine particles (M) are melted to undergo a diffusion reaction with an electrode of the semiconductor element, and an alloyed phase or a metal compound phase is formed. Furthermore, the metal fine particles (P) are aggregated at a temperature lower than the melting point of the metal in a bulk state due to the energy of the surfaces of the fine particles, binding (sintering) between the metal fine particle surfaces proceeds, and an electroconductive connection member 50 formed from a porous metal body is formed. When the organic solvent (SC) is contained in the organic solvent (S) during a heating treatment, since the solvent exhibits a reducing function in a liquid form and a gas form, oxidation of the metal fine particles (P) is suppressed, and sintering is accelerated. Incidentally, when an organic solvent (S) having a relatively low boiling point is contained as the organic dispersion medium (D) in the electroconductive bonding layer 13a, before the heating treatment, a drying step may be provided in advance to evaporate and remove at least a portion of the organic solvent (S). The semiconductor element 2 and the substrate 40 are mechanically bonded by such a heating treatment. Incidentally, the bonding step may be carried out without any added pressure, or pressure may be added. When pressure is added, the close adhesiveness between the electroconductive paste and a lead frame, a package substrate, or the like is enhanced.

Since the electroconductive connection member 50 is a porous metal body formed as the metal fine particles (P) are brought into planar contact and bound (sintered), the electroconductive connection member 50 has appropriate resilience and softness, and the electrical conductivity is not impaired. The porosity of the porous metal body is in the range of 1% to 9% by volume, and preferably 1% to 6% by volume, and the average pore diameter is in the range of 10 to 120 nm, and preferably 10 to 60 nm. Furthermore, the methods for measuring the porosity, the average primary particle size of the metal fine particles, and the average pore diameter in the electroconductive connection member 50 are as follows.

(1) Method for Measuring Average Primary Particle Size of Metal Fine Particles

With regard to metal fine particles, the cross-sections of ten randomly selected particles are observed using a scanning electron microscope (SEM), the diameters of maximum inscribed circles for the two-dimensional shapes of the cross-sections are measured, and the average value thereof is determined. Furthermore, in the electron microscopic photographs of the cross-sections, when the two-dimensional shape is an approximately circular shape, the diameter of the circle is measured; in the case of an approximately elliptical shape, the minor axis of the ellipse is measured; in the case of an approximately square shape, the length of a side of the square is measured; and in the case of an approximately rectangular shape, the length of a short side of the rectangle is measured.

(2) Method for Measuring Average Pore Diameter

With regard to the "average pore diameter", the cross-sectional shapes of ten to twenty randomly selected pore diameters are observed and measured using a scanning electron microscope (SEM), and the average value thereof is determined.

(3) Method for Measuring Porosity

The measurement of porosity can be determined by taking electron microscopic photographs using a transmission electron microscope (TEM), and performing an analysis of the cross-section images thereof. Furthermore, the porosity in the case where the pore size is smaller than 100 nm is measured by slicing the material by an ultramicrotome method and thereby observing the slices with a transmission electron microscope (TEM).

Subsequently, as shown in FIG. 6, a wire bonding step of electrically connecting the tip of a terminal part (not shown in the diagram) of the substrate 40 and an electrode pad (not shown in the diagram) on the semiconductor element 2 with a bonding wire 60, is carried out. As the bonding wire 60, for example, a gold wire, an aluminum wire, a copper wire, or the like is used. The temperature at the time of performing wire bonding is preferably 80° C. or higher, and more preferably 120° C. or higher, and the temperature is preferably 250° C. or lower, and more preferably 175° C. or lower. Furthermore, regarding the heating time, heating is carried out for several seconds to several minutes (for example, 1 second to 1 minute). Wire connection is carried out using the vibration energy given by ultrasonic waves and compression energy by applied pressure in combination in a state of being heated to be in the above-described temperature range.

Subsequently, an encapsulation step of encapsulating the semiconductor element 2 by means of an encapsulation resin 70 is carried out. The present step is carried out in order to protect the semiconductor element 2 and the bonding wire 60 mounted on the substrate 40. The present step is carried out by molding a resin for encapsulation in a mold. As the encapsulation resin 70, for example, an epoxy-based resin is used. The heating temperature at the time of resin encapsulation is preferably 165° C. or higher, and more preferably 170° C. or higher, and the heating temperature is preferably 185° C. or lower, and more preferably 180° C. or lower.

If necessary, the encapsulation product may be further heated (post-curing step). As a result, the encapsulation resin 70 that was insufficiently cured in the encapsulation step can be completely cured. The heating temperature can be appropriately set. As a result, the semiconductor device 100 is produced.

Incidentally, in the above-mentioned examples, a bonding film is used in the case of bonding the back face of a semiconductor element 2, where a circuit is not formed, and a substrate 40; however, the example is not limited to this, and the bonding film may also be used in the case of bonding the front surface of a semiconductor element 2, where a circuit is formed, and a substrate 40 (so-called flip-chip packaging).

Next, Examples of the invention will be described; however, the invention is not intended to be limited to these Examples.

[Production of Electroconductive Bonding Layer]

(Electroconductive Bonding Layer A)

70% by mass of copper fine particles (corresponding to the metal fine particles (P)) having an average primary particle size of 150 nm, which had been prepared from copper ions in an aqueous solution by electroless reduction, and 30% by mass of an organic dispersion medium composed of 95% by mass of a mixed solvent (corresponding to the organic solvent (S1)), which was composed of 40% by volume of glycerol, 55% by volume of N-methylacetamide, and 5% by volume of triethylamine as an organic solvent and 5% by mass of ethyl cellulose (average molecular weight 1,000,000) as an organic binder were kneaded to prepare an electroconductive paste.

A release film (50-μm polyethylene terephthalate film) was disposed on a placement stand, a spacer made of SUS having a 6-inch circular opening was disposed thereon at the central part to a thickness of 350 μm, 5.0 g of the above-mentioned electroconductive paste was placed on the release film facing the opening of the spacer, screen printing was performed using a squeegee to roll the electroconductive paste, and the electroconductive paste was molded into a circular sheet shape. Then, the spacer was removed, subsequently preliminary drying was carried out for 5 minutes in an inert atmosphere, and the electroconductive bonding layer A was produced.

(Electroconductive Bonding Layer B)

An electroconductive bonding layer B was produced in the same manner as in the case of the electroconductive bonding layer A, except that 70% by mass of silver fine particles having an average primary particle size of 100 nm (manufactured by Sigma-Aldrich Japan K.K., product No. 730777) were used instead of the copper fine particles.

[Production of Tack Layer]

(Tack Layer Composition A)

Furthermore, 10% by mass of polyglycerin and 90% by mass of methanol were mixed to dilute polyglycerin, and tin fine particles having an average primary particle size of 1.5 μm (manufactured by Mitsui Mining & Smelting Co., Ltd.) as the metal fine particles (M) were dispersed in the dilute polyglycerin solution to a concentration in percentage by weight of 0.1% by weight using an ultrasonic dispersing machine to prepare a tack layer composition. The proportion of the metal fine particles (M) with respect to the metal fine particles (P) was 0.1% by weight.

(Tack Layer Composition B)

A tack layer B was produced in the same manner as in the case of the tack layer A, except that the tin fine particles were dispersed in the dilute polyglycerin solution to a concentration in percentage by weight of 0.5% by weight. The proportion of the metal fine particles (M) with respect to the metal fine particles (P) was 0.5% by weight.

(Tack Layer Composition C)

A tack layer C was produced in the same manner as in the case of the tack layer A, except that the tin fine particles were disperse in the dilute polyglycerin solution to a concentration in percentage by weight of 1% by weight. The proportion of the metal fine particles (M) with respect to the metal fine particles (P) was 1% by weight.

(Tack Layer Composition D)

A tack layer D was produced in the same manner as in the case of the tack layer A, except that tin-nickel-copper alloy fine particles having an average primary particle size of 1.75 μm (manufactured by Mitsui Mining & Smelting Co., Ltd.) were used instead of the tin fine particles. The proportion of the metal fine particles (M) with respect to the metal fine particles (P) was 0.1% by weight.

(Tack Layer Composition E)

A tack layer E was produced in the same manner as in the case of the tack layer D, except that the tin-nickel-copper alloy fine particles were dispersed in the dilute polyglycerin solution to a concentration in percentage by weight of 1% by weight. The proportion of the metal fine particles (M) with respect to the metal fine particles (P) was 1% by weight.

(Tack Layer Composition F)

A tack layer F was produced in the same manner as in the case of the tack layer A, except that bismuth alloy fine particles having an average primary particle size of 2.0 μm (manufactured by Fukuda Metal Foil & Powder Co., Ltd.) were dispersed in the dilute polyglycerin solution to a concentration in percentage by weight of 0.5% by weight. The proportion of the metal fine particles (M) with respect to the metal fine particles (P) was 0.5% by mass.

(Tack Layer Composition G)

A tack layer G was produced in the same manner as in the case of the tack layer A, except that the tin fine particles were dispersed in the dilute polyglycerin solution to a concentration in percentage by weight of 0.01% by weight. The proportion of the metal fine particles (M) with respect to the metal fine particles (P) was 0.01% by weight.

(Tack Layer Composition H)

A tack layer H was produced in the same manner as in the case of the tack layer A, except that the tin fine particles were dispersed in the dilute polyglycerin solution to a concentration in percentage by weight of 2% by weight. The proportion of the metal fine particles (M) with respect to the metal fine particles (P) was 2% by weight.

(Tack Layer Composition I)

A tack layer I was produced in the same manner as in the case of the tack layer A, except that metal fine particles were not included.

Example 1

Then, on a hot plate that had been warmed to 50° C., the above-mentioned tack layer composition A was applied on the electroconductive bonding layer A by a spray coating method so as to obtain a film thickness after drying of 2 μm, and the tack layer composition A was dried at 50° C. for 180 seconds to form a tack layer. In this manner, a bonding film according to Example 1 was obtained.

Examples 2 to 6 and Comparative Examples 1 to 5

In the same manner, bonding films according to Examples 2 to 6 and Comparative Examples 1 to 5 were obtained by adopting the combinations of the electroconductive bonding layer and the tack layer shown in Table 1 and Table 2.

Production of Tape for Wafer Processing

On the other hand, a tacky adhesive film was produced as follows. To an acrylic copolymer having a weight average molecular weight of 800,000, which was synthesized by subjecting 65 parts by weight of butyl acrylate, 25 parts by weight of 2-hydroxyethyl acrylate, and 10 parts by weight of acrylic acid to radical polymerization, and adding 2-isocyanatoethyl methacrylate dropwise thereto to react with the radical polymerization product, 3 parts by weight of polyisocyanate as a curing agent and 1 part by weight of 1-hydroxy-cyclohexyl-phenyl-ketone as a photopolymerization initiator were added, and the mixture was mixed to prepare a tacky adhesive layer composition. The produced tacky adhesive layer composition was applied on a film (a film for coating other than the base material film) so as to obtain a dried film thickness of 10 μm and was dried at 120° C. for 3 minutes. Subsequently, the tacky adhesive layer composition applied on the film was transferred onto a polypropylene elastomer (elastomer of PP:HSBR=80:20) resin film having a thickness of 100 μm, which was the base material film, and thereby a tacky adhesive film was produced.

Incidentally, for the polypropylene (PP), NOVATEC FG4 manufactured by Japan Polychem Corporation was used, and for the hydrogenated styrene-butadiene (HSBR), DYNARON 1320P manufactured by JSR Corporation was used. Furthermore, for the film for coating, a silicone release-treated PET film (Teijin: HUPILEX S-314, thickness 25 μm) was used.

Subsequently, the electroconductive bonding layer of the above-described bonding film was pasted on the tacky adhesive layer of the above-described tacky adhesive film, and a tape for wafer processing was obtained.

[Production of Sample]

As a semiconductor wafer, a semiconductor wafer having a thickness of 230 μm and having various chip electrode layers of Ti/Au, Ti/Ag, Ti/Cu, and Ti/Ni formed on the surface was prepared. The thickness of the various chips was 100 nm. Furthermore, a semihard-tempered, oxygen-free copper plate having a thickness of 1.2 mm was prepared as a substrate. Each of the bonding films according to the Examples and Comparative Examples was placed on a hot plate that had been heated to 50° C. and was heated to be in a state in which the tackiness of the tack layer was increased, the front surface (surface on the electrode layer side of the semiconductor element) of the semiconductor wafer of the electrode of the kind shown in Table 1 and Table 2 was stuck to the tack layer, subsequently the assembly was returned to room temperature, and in a state in which the tack layer was cooled and cured, the semiconductor wafer was diced, together with the bonding film, into semiconductor chips having a size of 7 mm×7 mm by using a dicing device (manufactured by DISCO Corporation, DAD340 (trade name)). Subsequently, the semiconductor chips were irradiated with ultraviolet radiation through the base material film surface side of the tacky adhesive film using an ultraviolet irradiator with a high-pressure mercury lamp at an irradiation dose of 200 mJ/cm². Then, the tacky adhesive film was expanded using a die bonder (manufactured by Canon Machinery, Inc., CPS-6820 (trade name)), the semiconductor chips were picked up in that state together with the bonding film, and the electroconductive bonding layer side of the bonding film was placed on the substrate.

Subsequently, the above-mentioned laminates of the semiconductor chip, the bonding film, and the substrate were each heated such that a laminate having the electroconductive bonding layer formed using a copper microparticle paste was heated at 300° C. for 60 minutes, and a laminate having the electroconductive bonding layer formed using a silver microparticle paste was heated at 250° C. for 60 minutes, to sinter the electroconductive bonding layer, and twenty packaged samples were produced.

Each of the packaged samples was subjected to a temperature cycle test (TCT), in which maintaining at −55° C. for 30 minutes and at 200° C. for 30 minutes was defined as one cycle. The sample was taken out after every 100 times, and it was visually inspected to see whether cracking and peeling occurred. Subsequently, the packaged sample was irradiated with ultrasonic waves through the semiconductor chip side using an ultrasonic microscope (manufactured by Hitachi Construction Machinery Co., Ltd., Mi-Scope (trade name)) and a probe (Model "PQ2-13", 50 MHz), and measurement of peeling was performed by a reflection method. A sample having a peeling area of more than 10% was considered as failure. A packaged sample which used each of the bonding films according to the present Examples and Comparative Examples and in which the number of times of TCT counted until the packaged sample was considered as failure was 2500 to 3000 times, was considered as an article of excellent quality and was rated as A; a packaged sample in which the number of times of TCT was 1000 to 2000 times was considered as an article of good quality and was rated as B; and a packaged sample in which the number of times of TCT was 1000 times or fewer was considered as an article of poor quality and was rated as Cde. Then, a bonding film that was rated as B or higher, including rating of A, for the bonding to all kinds of electrodes was evaluated as an article of excellent quality and was rated as ⊙; a bonding film that was rated as B for the bonding to all kinds of electrodes was evaluated as an article of good quality and was rated as ○ and a bonding film that was rated as C for the bonding to any one electrode was evaluated as an article of poor quality and was rated as ×. The results are shown in Tables 1 and 2.

TABLE 1

|  | Example 1 | Example 2 | Example 3 | Example 4 | Example 5 | Example 6 |
|---|---|---|---|---|---|---|
| Electroconductive bonding layer | A | A | A A | A | A | B B B B |
| Tack layer | A | B | C | D | E | B |
| Percent (%) by weight of metal fine particles (M) with respect to metal fine particles (P) | 0.1 | 0.5 0.5 0.5 | 1 1 | 0.1 | 1 | 0.5 0.5 0.5 0.5 |
| Particle size (μm) of metal fine particles (M) | 1.5 | 1.5 | 1.5 | 1.75 | 1.75 | 1.5 |
| Electrode of semiconductor element | Cu | Ag Cu Au Ni | Cu Ag | Cu | Cu | Ag Cu Au Ni |
| Results of temperature cycle test (TCT) | A | B B B B | B B | A | B | B B B B |
| Evaluation of temperature cycle test | ⊙ | ○ | ○ | ⊙ | ○ | ○ |

TABLE 2

|  | Comparative Example 1 | Comparative Example 2 | Comparative Example 3 | Comparative Example 4 | Comparative Example 5 |
|---|---|---|---|---|---|
| Electroconductive bonding layer | A A A A | B B B B | B | A | A |
| Tack layer | I | I | F | G | H |
| Percent (%) by weight of metal fine particles (M) with respect to metal fine particles (P) | — | — — — — | 0.5 | 0.01 | 2 |
| Particle size (μm) of metal fine particles (M) | — | — | 2.0 | 1.5 | 1.5 |
| Electrode of semiconductor element | Cu Ag Au Ni | Cu Ag Au Ni | Au | Ag | Ag |
| Results of temperature cycle test (TCT) | B C B C | C B B C | C | C | C |
| Evaluation of temperature cycle test | × | × | × | × | × |

In Examples 1 to 6, as shown in Table 1, since the tack layer includes 0.1% to 1.0% by weight of the metal fine particles (M) with respect to the metal fine particles (P) in the electroconductive bonding layer, satisfactory bonding to the substrate is achieved irrespective of the type of the electrode of the semiconductor element, and satisfactory results were obtained in the temperature cycle test evaluation.

In contrast to this, in Comparative Examples 1 and 2, as shown in Table 2, since the tack layer did not include the metal fine particles (M), satisfactory bonding to the substrate was not achieved depending on the type of the electrode of the semiconductor element, and inferior results were obtained in the temperature cycle test evaluation. In Comparative Example 3, since the melting point of the metal fine particles (M) is higher than 250° C. and since an alloy phase with the electrode was not formed, the bonding state was not satisfactory, and inferior results were obtained in the temperature cycle test evaluation. In Comparative Example 4, since the content proportion of the metal fine particles (M) was as small as 0.01% by weight with respect to the metal fine particles (P), an alloy phase of the metal fine particles (M) and the electrode was not sufficiently formed at the interface between the porous metal body and the electrode of the semiconductor element after bonding, satisfactory bonding to the substrate was not achieved depending on the type of the electrode of the semiconductor element, and inferior results were obtained in the temperature cycle test evaluation. In Comparative Example 5, since the content proportion of the metal fine particles (M) was as large as 2% by weight with respect to the metal fine particles (P), an alloy phase of the metal fine particles (M) and the electrode was formed excessively thickly at the interface between the porous metal body and the electrode of the semiconductor element after bonding, satisfactory bonding to the substrate was not achieved depending on the type of the electrode of the semiconductor element, and inferior results were obtained in the temperature cycle test evaluation.

EXPLANATIONS OF LETTERS OR NUMERALS

2 SEMICONDUCTOR ELEMENT
10 TAPE FOR WAFER PROCESSING
11 RELEASE FILM
12 TACKY ADHESIVE FILM
12a BASE MATERIAL FILM
12b TACKY ADHESIVE LAYER
13 BONDING FILM
13a ELECTROCONDUCTIVE BONDING LAYER
13b TACK LAYER
40 SUBSTRATE

The invention claimed is:

1. A bonding film for bonding a semiconductor element and a substrate,
the bonding film comprising:
an electroconductive bonding layer formed by molding an electroconductive paste including metal fine particles (P) into a film form; and
a tack layer having tackiness and laminated on the electroconductive bonding layer,
wherein the tack layer includes 0.1% to 1.0% by weight of metal fine particles (M) with respect to the metal fine particles (P) in the electroconductive bonding layer, and
the metal fine particles (M) have a melting point of 250° C. or lower.

2. The bonding film according to claim 1, wherein the metal fine particles (P) have an average primary particle size of 10 to 500 nm.

3. The bonding film according to claim 1, wherein the electroconductive paste includes an organic solvent(S).

4. The bonding film according to claim 1, wherein the metal fine particles (P) include copper or silver.

5. The bonding film according to claim 1, wherein the electroconductive paste includes an organic binder (R).

6. The bonding film according to claim 1, wherein the tack layer is formed from one kind or two or more kinds selected from polyglycerin, a glycerin fatty acid ester, a polyglycerin fatty acid ester, phosphines, phosphites, sulfides, disulfides, trisulfides, and sulfoxides.

7. The bonding film according to claim 1, wherein the metal fine particles (M) have an average primary particle size of 1 3 μm.

8. The bonding film according to claim 1, wherein the metal fine particles (M) include tin.

9. The bonding film according to claim 3, wherein the organic solvent(S) includes an organic solvent (SC) having a boiling point at normal pressure of 100° C. or higher, the organic solvent (SC) being formed from an alcohol and/or polyhydric alcohol having one or two or more hydroxyl groups in the molecule.

10. The bonding film according to claim 5, wherein the organic binder (R) is one kind or two or more kinds selected from a cellulose resin-based binder, an acetate resin-based binder, an acrylic resin-based binder, a urethane resin-based binder, a polyvinylpyrrolidone resin-based binder, a polyamide resin-based binder, a butyral resin-based binder, and a terpene-based binder.

11. A tape for wafer processing comprising:
a tacky adhesive film having a base material film and a tacky adhesive layer provided on the base material film; and
the bonding film according to claim 1,
wherein the electroconductive bonding layer of the bonding film is provided on the tacky adhesive layer.

12. A method for producing a bonded body, the method comprising a bonding step of disposing a bonding film between a semiconductor element and a substrate, the bonding film having an electroconductive bonding layer formed by molding an electroconductive paste including metal fine particles (P) into a film form; and a tack layer having tackiness, including metal fine particles (M), and being laminated on the electroconductive bonding layer, subsequently heating the assembly, and after the tack layer is thermally decomposed and the metal fine particles (M) melt and then react with the electrode of the semiconductor element, sintering the metal fine particles (P) of the electroconductive bonding layer to bond the semiconductor element and the substrate.

13. A bonded body of a semiconductor and a substrate,
the bonded body comprising, on a substrate, an electroconductive connection member formed from a porous metal body and comprising a semiconductor element thereon,
wherein the bonded body is bonded using the bonding film according to claim 1,
the porous metal body is a sintered body of metal fine particles (P) included in the bonding film according to claim 1, and
at the interface between the porous metal body and an electrode of the semiconductor element, an alloy phase or a metal compound phase of metal fine particles (M) included in the bonding film according to claim 1 and the electrode is formed.

14. The bonded body of a semiconductor and a substrate according to claim 13, wherein the porosity of the porous metal body is 1% to 6% by volume, and the average pore diameter is 10 to 60 nm.

15. A pasted body comprising:
a tacky adhesive film having a base material film and a tacky adhesive layer provided on the base material film;
a bonding film for bonding a semiconductor element and a substrate; and
a semiconductor wafer pasted together,
wherein the bonding film has an electroconductive bonding layer formed by molding an electroconductive paste including metal fine particles (P) into a film form; and a tack layer having tackiness and laminated on the electroconductive bonding layer,
the electroconductive bonding layer is pasted to the tacky adhesive layer, the semiconductor wafer is pasted to the tack layer,
the tack layer is thermally decomposable and includes 0.1% to 1.0% by weight of metal fine particles (M) with respect to the metal fine particles (P) in the electroconductive bonding layer, and
after the tack layer is thermally decomposed by heating at the time of bonding and the metal fine particles (M) melt and react with an electrode of the semiconductor element, the metal fine particles (P) of the electroconductive bonding layer are sintered to bond the semiconductor element and the substrate.

16. The bonding film according to claim 2, wherein the metal fine particles (P) include copper or silver.

17. The bonding film according to claim 2, wherein the electroconductive paste includes an organic binder (R).

18. The bonding film according to claim 2, wherein the tack layer is formed from one kind or two or more kinds selected from polyglycerin, a glycerin fatty acid ester, a polyglycerin fatty acid ester, phosphines, phosphites, sulfides, disulfides, trisulfides, and sulfoxides.

19. The bonding film according to claim 2, wherein the metal fine particles (M) have an average primary particle size of 1 to 3 µm.

20. The bonding film according to claim 2, wherein the metal fine particles (M) include tin.

* * * * *